United States Patent [19] [11] 3,813,587
Umeda et al. [45] May 28, 1974

[54] LIGHT EMITTING DIODES OF THE INJECTION TYPE

[75] Inventors: Jun-Ichi Umeda; Junio Aiki; Kazuhiro Kurata, all of Hachioji; Hazime Kusumoto, Tama, all of Japan

[73] Assignee: Hitachi, Ltd., Tokyo, Japan

[22] Filed: May 4, 1973

[21] Appl. No.: 357,088

[30] Foreign Application Priority Data
May 4, 1972 Japan ............................ 47-43606

[52] U.S. Cl....317/235 N, 317/235 AC, 317/235 AK, 317/235 AJ
[51] Int. Cl. ............................................ H05b 33/00
[58] Field of Search .. 317/235 N, 235 AC, 235 AK, 317/235 AJ

[56] References Cited
UNITED STATES PATENTS

| | | | |
|---|---|---|---|
| 3,371,213 | 2/1968 | Adams | 250/211 |
| 3,537,029 | 10/1970 | Kressel | 331/94.5 |
| 3,560,275 | 2/1971 | Kressel | 148/171 |
| 3,604,991 | 9/1971 | Yonezu | 317/235 |
| 3,617,820 | 11/1971 | Herzog | 317/234 |
| 3,667,007 | 2/1970 | Kressel | 317/235 R |
| 3,752,713 | 8/1973 | Sakuta | 148/171 |
| 3,758,875 | 9/1973 | Hayashi | 331/94.5 |

*Primary Examiner*—Martin H. Edlow
*Attorney, Agent, or Firm*—Craig and Antonelli

[57] ABSTRACT

In a PN junction light emitting diode of the injection type comprising a first semiconductor region having a forbidden band width equal at most, to the width of a PN junction forbidden band, a second semiconductor region having a forbidden band width greater than the width of a PN junction forbidden band, and at least one pair of electrodes affixed to each of a P conductive region and an N conductive region, the light extraction efficiency can be greatly increased by constructing the diode so that the sum of the area $S_A$ of the boundary between the first semiconductor region and the second semiconductor region and the bottom area $S_C$ of the electrode mounted on the surface of the second semiconductor region $(S_A + S_C)$ is sufficiently smaller than the area S obtained by subtracting the area $(S_A + S_C)$ from the total surface area of the second semiconductor region.

16 Claims, 3 Drawing Figures

LIGHT EMITTING DIODES OF THE INJECTION TYPE

This invention relates to a light emitting diode of the injection type which is so constructed that the light emission, obtained by biasing, in sequential directions, a light emitting diode composed of semiconductors of different forbidden band width, can be extracted at a high efficiency.

In a light emitting diode of the injection type (hereinafter referred to as merely as "diode"), the following techniques have heretofore been adopted for extracting, at a high efficiency, the light emission obtained when the diode is biased in sequential directions:

1. A semiconductor extending from the light emitting region (PN junction region) in the crystal of the diode to the diode surface is constructed of a semiconductor having a forbidden band width Eg of an energy greater than the light emitting energy $h\nu$ (in which h is Planck's constant and $\nu$ is the frequency of the light), whereby the loss of the light during its travel to the diode surface caused by absorption of the light in the semiconductor material is reduced to a level as low as possible;

2. The surface of the diode is molded to have a dome-like form or a tapered cylinder-like form so that the light reaching the diode surface from the light emitting region or once reflected lights is incident on the surface of the diode at an angle not greater than the critical angle for total reflection;

3. The techniques 1 and 2 are adopted in combination.

In general, the semiconductor material constituting such a diode has a high refractive index (3.6 in the case of GaAs and 3.4 in the case of GaP), and hence, the critical angle is small (16° in the case of GaAs and 17° in the case of GaP). Accordingly, in the method 1, if the semiconductor is molded into a plane plate, the majority of the internal light emission is reflected on the surface of the diode and absorbed in the interior. Further, methods (2) and (3) are defective in that the processing and finishing steps include the step of polishing the diode surface are very complicated and the mass-production is very difficult, and that if dimensions such as the dome diameter are increased in order to facilitate the processing and finishing operations, the light absorption in the interior of the diode is drastically increased.

This invention has now been achieved as a result of research work carried out to provide a diode free of the foregoing defects involved in the conventional diodes. It is, therefore, a primary object of this invention to provide a light emitting diode of the injection type having such a structure that the light emission in the interior of the diode can be extracted from the interior of the diode at a high efficiency.

This object can be attained by a light emitting diode of the injection type comprising a P conductive region and an N conductive region positioned on both sides of the PN junction boundary formed therebetween, each of the P conductive region and the N conductive region being composed of at least one semiconductor region having one boundary surface adjacent the PN junction boundary face and the other surface extending continuously to the end surface of a conductor region, each of the semiconductors of the P conductive region and N-conductive region being constructed of a first semiconductor region having a forbidden band width at most equal to the forbidden band width of the PN junction and a second semiconductor region having a forbidden band width greater than the forbidden band width of the PN junction. Each of the P conductive region and N conductive regions includes at least one pair of electrodes disposed thereon, and the sum of the area $S_A$ of the boundary face between the first semiconductor region and the second semiconductor region and the bottom surface $S_C$ of the electrode disposed on the surface of the second semiconductor region $(S_A + S_C)$ is made sufficiently smaller than particularly less than 1/10 of, the area S obtained by subtracting the area $(S_A + S_C)$ from the total surface area of the second semiconductor region.

The photon energy $h\nu$ (in which $h$ is Planck's constant and $\nu$ is the frequency of the emitted light) obtained when the PN junction is biased in sequential directions has the following relationship with the forbidden band width Eg of the crystal of the light-emitting portion:

$$h\nu \quad Eg$$

Accordingly, the light absorption by the matrix in the above-mentioned second semiconductor region is generally very low. The above-mentioned emitted light which has been released into the second semiconductor region is attenuated only by (a) the light absorption by the matrix in the second semiconductor region, (b) the external leakage from the surface S of the second semiconductor region and (c) the light absorption in the areas $S_C$ and $S_A$.

The above absorption (a) can be greatly reduced by making the forbidden band width Eg of the second semiconductor region greater than the forbidden band width in the PN junction. The leakage (b) is the light itself extracted from the interior. Accordingly, it is desired that the leakage (b) is as great as possible. The light absorption (c) cannot be eliminated.

Accordingly, it is possible to effectively extract the internal light emitted in the diode without such complicated processing operations as mentioned in (2) above, if the ratio of the light absorption (c) to the external leakage (b) is made sufficiently small, namely if the ratio $[\gamma = S/(S_A + S_C)]$ is made sufficiently large.

In the case of semiconductors in which the forbidden band width Eg of the semiconductor region is such as will enable the visible-to-near infrared light emission, such as GaAs, GaP, $GaAs_{1-x}P_x$, $Ga_{1-x}Al_xAs$ and $Ga_{1-x}In_xP$ ($x$ is within a range of from 0 to 1), if the external portion is coated with a transparent resin such as an epoxy resin, about 5 percent on the average of the quantity of light in the vicinity of the internal surface of the crystal leaks outside, and the remaining 95 percent is reflected into the interior. In the worst case, where substantially all of the light directed to $S_A$ and $S_C$ is absorbed, 50 percent of the total quantity of the light in the vicinity of $S_A$ and $S_C$ is absorbed in $S_A$ and $S_C$. Accordingly, when the ratio $\gamma$ is 10, the quantity of the light coming out from the interior into the outside is equal to the quantity of the light absorbed in $S_A$ and $S_C$. In other words, only when the ratio $\gamma$ is greater than 10, the quantity of the light extracted into the outside can be made greater than the quantity of the light absorbed in the interior.

In general, it is theoretically estimated, as regards the plate crystal that in the case of $\gamma = 10$ the quantity of the light externally extractable is about 25 percent of the quantity of the light emitted in the interior of the diode, and that in the case of $\gamma = 50$ the ratio of the extractable light is increased to about 38 percent, and in the case of $\gamma = 100$ it reaches about 41 percent. These values are 3 to 5 times as high as the value obtainable in the conventional technique (1) (about 8 percent), and it is seen that the effect attained by this invention is extremely significant.

As described above, in the light emitting diode of the injection type of this invention, the sum of area $S_C$ of the portion of the electrode disposed on one surface of the second semiconductor region where the electrode is in the state alloyed with the second semiconductor region (approximating the bottom area of the electrode) and the area $S_A$ of the boundary face between the first semiconductor region and the second semiconductor region, namely the area $(S_A + S_C)$, is made sufficiently smaller than the area S obtained by subtracting $(S_A + S_C)$ from the total surface area of the second semiconductor region. In the light emitting diode of the above structure, if the light emission by direct transition is utilized and the composition of the PN junction is adjusted to $GaAs_{1-x}P_x$ (in which x is within a range of from 0 to 0.45), $Ga_{1-x}Al_xAs$ (in which $x$ is within the range of from 0 to 0.31) or $In_{1-x}Ga_xP$ (in which $x$ is within a range of from 0 to 0.8, the value of 0.8 being excluded), the first semiconductor region is allowed to have an energy band structure of the direct transition type and hence, it can possess a high absorption coefficient. Accordingly, better results are obtained.

Furthermore, if the diode is constructed so that it has the structure according to this invention, the emitted light of the PN junction need not be made incident directly on the surface of the semiconductor region with an angle not exceeding the critical angle for total reflection and, therefore, the positional relation of the PN junction to the entire semiconductor region is not particularly critical and it is possible to dispose a plurality of PN junctions spaced from each other with respect to one crystal.

Figure 1:
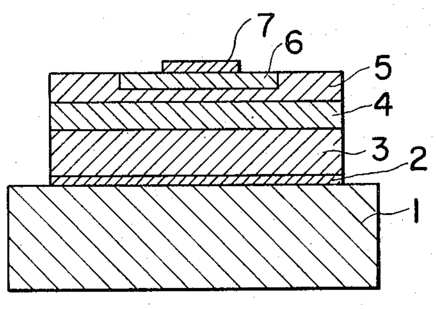
FIG. 1 is a diagram illustrating the longitudinal section of the conventional diode.

In the conventional $GaAs_{1-x}P_x$ diode illustrated in FIG. 1 reference numerals 1, 2 and 3 indicate a metallic stem, a metal electrode for the N-type material and a GaAs substrate plate of the N-type. On the GaAs substrate plate 3 of the N-type, there is epitaxially grown a layer 4 of the N-type $GaAs_{1-x}P_x$ having a composition where the value of x is within a range of from 0 to 0.4 and it increases as the distance from the top face of the GaAs substrate becomes greater. A layer 5 is composed of an N-type $GaAs_{1-x}P_x$ crystal having a composition in which the value of $x$ is fixed at 0.4. A layer 6 of a P-type $GaAs_{1-x}P_x$ crystal (in which $x$ is 0.4) is formed on the layer 5 by selectively diffusing Zn into the N-type $GaAs_{1-x}P_x$ crystal layer 5. Reference numeral 7 indicates a metal electrode for the P-type material.

Typical instances of the dimensions of the foregoing sructural elements will now be described. The size of the total crystal is 500 $\mu \times$ 500 $\mu \times$ 200 $\mu$ (thickness) and the thickness of the N-type GaAs substrate plate is about 150$\mu$. The thickness of the layer 4 is about 30 $\mu$ and the thickness of the layer 5 is about 20$\mu$. The depth of the P-type layer 6 is about 2.5$\mu$ and its diameter is 400$\mu$. Further, the diameter of the electrode 7 is 100$\mu$.

The $GaAs_{1-x}P_x$ crystal is formed according to a so-called vapor phase epitaxial growth method by passing a mixed gas of HCl, $PH_3$ and $AsH_3$ or $PCl_3$ and $AsCl_3$ or a combination thereof on metallic Ga together with a hydrogen ($H_2$) gas flow, contacting it with a GaAs substrate maintained at a temperature of about 850° C thereby forming an epitaxial layer on the GaAs substrate. The amount $x$ of P in the mixed crystal of P and As can be adjusted by controlling the ratio of partial pressures of $PH_3$ and $AsH_3$ or $AsCl_3$ and $PCl_3$ or the partial pressures in a combination of these mixed gases. Doping the N-type donor impurities can be accomplished by incorporation of a minute amount of $H_2S$ or $H_2Se$ gas or other means.

In the diode of the above-mentioned structure, the external quantum efficiency of the light emitted in the vicinity of 6,500A is 0.2 percent on the average and 0.5 percent at its maximum at 8 A/cm$^2$.

DESCRIPTION OF THE PREFERRED EMBODIMENTS:

EXAMPLE 1

Figure 2:
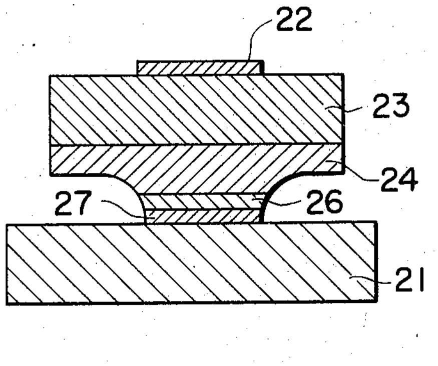
FIG. 2 is a diagram illustrating the longitudinal section of one embodiment of the diode of this invention.

One embodiment of the $GaAs_{1-x}P_x$ diode of this invention is illustrated in FIG. 2. In FIG. 2, reference numerals 21, 22 and 23 indicate a metallic stem, a metal electrode for the N-type material and a GaP substrate plate. An alloy layer is formed by the reaction in the contact area between the metal electrode for the N-type material and the GaP substrate plate. A layer 24 of N-type $GaAs_{1-x}P_x$ crystal is epitaxially grown on the GaP substrate plate 23 and in this layer 24, the ingredient composition is so adjusted that the value of $x$, namely the amount of phosphorus in the mixed crystal is within a range of from 1 to 0.4 and it becomes smaller as the distance spaced from the GaP substrate plate 23 increases. A layer 26 of a $GaAs_{1-x}P_x$ crystal (in which the value of $x$ is gradually changed from 1 to 0.4) is formed by selectively diffusing Zn into the layer 24 and etching the Zn-diffused layer into mesa-like form by employing, for instance, an etching solution of $H_2SO_4/H_2O_2/H_2O$ at a ratio of 1/1/1. Reference numeral 27 indicates a metal electrode for the N-type material. The total dimension of the crystal is 500 $\mu \times$ 500 $\mu \times$ 200 $\mu$ (thickness). The thickness of the layer 23 is 150$\mu$, the thickness of the layer 24 is 45$\mu$ and the thickness of the layer 26 is 5 $\mu$, while the etching depth is 15 $\mu$. The diameter of the electrode 22 is 100 $\mu$, and each of the layers 26 and 27 has a diameter of 100$\mu$. In the injection type light emitting diode of this invention having the foregoing structure, the layer 26 corresponds to the first semiconductor region, and the substrate plate 23 and layer 24 correspond to the second semiconductor region. Formation of the $GaAs_{1-x}P_x$ crystal layer may be accomplished by a customary method such as described with respect to the conventional diode shown in FIG. 1.

In the case of the diode of the above-mentioned structure emitting light at a wavelength of about 6,500A, the external quantum efficiency as measured at room temperature and an electric current density of 8 A/cm$^2$ is 1.7 percent on the average and 4.4 percent at its maximum. Thus, it will readily be understood that in the diode of this invention the light extraction efficiency is improved about 8.5 times over the light extraction efficiency of the conventional diode having such a structure as illustrated in FIG. 1.

In case the diameter of the layer 26 is changed to 200 $\mu$ ($\gamma = 23$), 300 $\mu$ ($\gamma = 11$) and 400 $\mu$ ($\gamma + 6.2$), the light extraction efficiency as measured at a current density of 8 A/cm$^2$ is 1.4 percent, 1.0 percent and 0.75 percent, respectively. Further, in case the layer 26 is formed into a 500 $\mu$ square ($\gamma = 2.6$), the light extraction efficiency is 0.4 percent on the average. When the layer 26 is formed by the selective diffusion method without mesa-etching, the diameter of the layer 26 varies within a range of from 100 to 400 $\mu$ and the light extraction efficiency as measured at a current density of 8 A/cm$^2$ is 0.4 percent on the average.

From the foregoing results, the following can be seen.

In the conventional diode having a structure as shown in FIG. 1, the emitted light reflected internally on the surface of the layer 6 is completely absorbed in the layers 4 and 3 having a forbidden band width narrower than that of the layer 6 (hence, the value of $x$ is smaller). In contrast, in the diode of this invention having a structure shown in FIG. 2, a considerable portion of the emitted light which has reached the surface of the layer 23 and is reflected internally therefrom is extracted outside the crystalline diode while it repeats internal reflection on the surface portions of layers 23 and 24 except for portions 22 and 26 of a small area, and as the areas of portions 22 and 26 are made smaller, a higher light extraction efficiency can be obtained. This effect attained by this invetion can readily be understood from the foregoing results.

In the structure illustrated in FIG. 2, mesa-etching makes a great contribution in increasing the light extraction efficiency in the diode. When such mesa-etching is carried out, the layer having a forbidden band width almost equal to that of the light emitting portion and bringing about a large degree of light absorption is removed from the light emitting portion of a small area and the light repeats reflection in the layers 23 and 24 of less light absorption. From the foregoing results, it can also be understood that in case the layer 26 is formed by the selective diffusion without conducting the mesa-etching, a $GaAs_{1-x}P_x$ crystal layer of a high absorption coefficient is left unremoved on the surface of the layer 24 (corresponding to the $\gamma$ value of 2.6) and therefore, the light released into the layers 23 and 24 is greatly absorbed in this remaining crystal layer to greatly reduce the degree of improvement of the extraction efficiency.

From the foregoing, it is seen that the efficiency of extracting the light emitted in the interior of the diode can be greatly improved when the value $\gamma$ is greater than 10.

EXAMPLE 2

Figure 3:
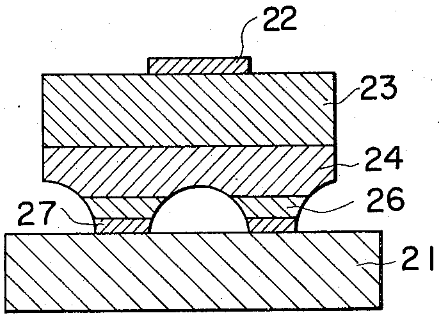
FIG. 3 is a diagram illustrating the longitudinal section of another embodiment of the diode of this invention.

FIG. 3 illustrates a modification of the diode shown in FIG. 2, where a plurality of portions 26 are formed in common with portions 23 and 24. More specifically, the structure shown in FIG. 3 is the same as the structure shown in FIG. 2 except that four portions 26 are formed.

When the structure shown in FIG. 3 is adopted, even when the diameter of the portion 26 is as small as 100 $\mu$, the crystal can be stably mounted and bonded on the metallic stem 21 via the metal electrode 27.

In the case of the diode of the above structure where four portions 26 of a diameter of 100 $\mu$ are disposed, the light extraction efficiency obtained when a sequential-direction current of a density of 8 A/cm$^2$ is passed through this $GaAs_{1-x}P_x$ diode is 0.75 percent. This means that the light extraction efficiency is quite in agreement with the light extraction efficiency of the diode of the structure shown in FIG. 2 where the sum of the total area of the PN junction and the area of the alloyed portion of the metal electrode for the N-type material (approximating the bottom area of the metal electrode for the N-type material) is equal to that of the diode shown in FIG. 3. Thus, it will readily be understood that the positional relation of the PN junction to the entire of the crystal is not critical. Accordingly, in the diode of this invention, a plurality of PN junctions may be disposed and hence, the construction of the diode can be advantageously facilitated.

EXAMPLE 3

In connection with the embodiment illustrated in FIG. 2, the thickness of the layer 23 is changed within a range of from 10 to 450 $\mu$ by the polishing method and the corresponding change in the external quantum efficiency is examined. In case the sum of the thickness of the layer 23 and that of the layer 24 is smaller than the diameter of the layer 26, the external quantum efficiency $\eta_{ex}$ is found to decrease abruptly. This is due to the fact that if the thickness of the layers 23 and 24 is too small, the light emitted from the layer 26 cannot be distributed in the state diffused sufficiently in the entire of the layers 23 and 24 and the same result as that by the practical reduction of the value $\gamma$ is brought about. It is found that the minimum diameter of the layer 26 in this Example is 100 $\mu$ and the thickness of the layer 24 should be 40 $\mu$ or more in order to compensate for any irregularity of the crystal lattice and that the effect intended in this invention is most significant when the thickness of the layer 26 is made greater than 50 $\mu$.

Examples 1 and 2 illustrate diodes comprising the $GaAs_{1-x}P_x$ crystal layer in which the ratio $x$ of P to As in the mixed crystal is adjusted to 0.4 in the PN junction area. However, a similar effect can be obtained as long as the value x is within a range of from 0 to 0.45.

In case the ratio $x$ of P to As in the mixed crystal on the Pn junction boundary face is within a range of $0.45 < x < 1$, though the effect owing to the ratio of the area $S_C$ is quite the same as in the case of 0 $x$ 4.5 the effect owing to the ratio of the $S_A$ area is a little lower than in the case of 0 $x$ 0.45. However, also in this case, the external quantum efficiency as a whole is improved two to four times over the plane plate crystal of the conventional structure.

In the foregoing Examples, the crystal layer is formed by the vapor phase growth method. The effect attained by this invention, however, is due to the specific geometrical structure, and it is not influenced by the method of formation of the crystal. For instance, the epitaxially grown $GaAs_{1-x}P_x$ crystal layer obtained prior to the mesa-etching in the embodiment of FIG. 2 can also be formed by dipping a GaP single crystal substrate in a Ga solution containing small amounts of GaP and GaAs and gradually cooling it from 1,000°C to 800°C. Even when the so formed crystal is employed, there can be obtained an effect similar to the effect attained with use of the crystal formed by the vapor phase growth method, and a significant improvement over the conventional diode can be similarly obtained.

As is seen from the foregoing results, such a prominent effect of this invention can be obtained only by the specific geometrical structure of the forbidden band widths of the semiconductors constituting the diode and by the specific relationship between the boundary face area of the second semiconductor region having a forbidden band width greater than the forbidden band width of the PN junction and the first semiconductor region having a forbidden band width at most equal to the forbidden band width of the PN junction, and the areas of the alloyed portions of the electrodes of the second semiconductor region. Thus, the prominent effect of this invention is not at all influenced by the method according to which the semiconductor material is formed.

In addition to the $GaAs_{1-x}P_x$ type semiconductor crystal illustrated in the foregoing embodiments, in this invention there may be similarly employed semiconductor crystals of the $Ga_{1-x}Al_xAs$ and $Ga_{1-x}In_xP$ types, and diodes having excellent characteristics similar to those of the diodes illustrated in the foregoing embodiments can be obtained.

In the foregoing embodiments, this invention is described only with reference to the structure of the diode as the discrete type light emitting diode. As is apparent to those skilled in the art, this invention includes various other applications. For instance, the structure of the diode of this invention may be utilized for a light emitting element for indicating figures, letters and the like which comprises a plurality of arranged diodes. In such case, it is sufficient that the PN junction boundary face and the semiconductor regions in such indicating element are constructed so that the above-mentioned relationship will be established.

We claim:

1. A light emitting diode of the injection type comprising:

a semiconductor body including a first semiconductor layer including a first semiconductor region of a first conductivity type and a second semiconductor layer having a second semiconductor region of a second conductivity type, opposite said first conductivity type, forming a PN junction with said first region at the interface between said first and second layers, said first semiconductor region having a forbidden band width equal at most to the forbidden band width of said PN junction and said second semiconductor region having a forbidden band width greater than the forbidden band width of said PN junction; and first and second electrodes respectively connected to the surfaces of said first and second semiconductor layers;

wherein the sum $(S_A + S_C)$ of the areas $S_A$ of the boundary surface between said first region of said first semiconductor layer and said second region of said second semiconductor layer and the area $S_C$ of the surface of said second electrode contacting said second semiconductor layer is less than the difference between the total surface area of said second semiconductor layer and said sum $(S_A + S_C)$ by a prescribed amount.

2. A light emitting diode according to claim 1, wherein said prescribed amount is 1/10.

3. A light emitting diode according to claim 2, wherein each of said first and second semiconductor layers is composed of a compound selected from the group consisting of $GaAs_{1-x}P_x$, $Ga_{1-x}Al_x P$ and $Ga_{1-x}In_xP$, wherein $x$ has a value within a range from 0 to 1, and varies within said range in said layers.

4. A light emitting diode according to claim 1, wherein each of said first and second semiconductor layers is composed of a compound selected from the group consisting of $GaAs_{1-x}P_x$, $Ga_{1-x}Al_xP$ and $Ga_{1-x}In_xP$, wherein 0  $x$  1 and said first and second regions forming said PN junction at the interface therebetween are formed of a compound selected from the group consisting of $GaAs_{1-x}P_x$ 0  $x$  0.45, $Ga_{1-x}Al_xAs$ 0  $x$  0.31 and $In_{1-x}Ga_xP$ 0  $x <$ 0.8.

5. A light emitting diode according to claim 1, wherein each of said first and second semiconductor layers is composed of $GaAs_{1-x}P_x$ $0 < x < 1$, the forbidden band width in said layers depending upon the value of $x$.

6. A light emitting diode according to claim 5, wherein said second layer includes a GaP crystal region extending from said second region in a direction orthogonal to said PN junction to a thickness greater than 50 $\mu$.

7. A light emitting diode according to claim 6, wherein said first and second regions forming said PN junction at the interface therebetween are composed of $GaAs_{1-x}P_x$ 0  $x$  0.45.

8. A light emitting diode of the injection type comprising:

a GaP substrate of N-type conductivity;

an epitaxial crystal layer of $GaAs_{1-x}P_x$, $0 < x < 1$ having N-type conductivity disposed on said substrate with the value of x decreasing with an increase in the distance within said layer from the surface of said substrate on which said layer is disposed and having a mesa-shaped portion opposite the surface of said substrate;

a P-type diffusion region extending into the mesa-shaped portion of said epitaxial crystal layer from the surface thereof opposite the surface disposed on said substrate to that position within said epitaxial crystal layer where the value of $x$ is said epitaxial crystal layer of $GaAs_{1-x}P_x$ is within the range of 0 to 0.45, said P-type diffusion region forming a PN junction with said N-type crystal layer; and an electrode disposed on said GaP substrate;

wherein the sum of the area of said PN junction and the contact surface of said electrode on said GaP substrate is less than one-tenth of the surface area of the substrate and the N-type crystal less the area of the contact surface of said electrode.

9. An injection type light emitting diode comprising:

a semiconductor substrate of a first conductivity type having a first surface on one side thereof and a second surface on the opposite side thereof;

a first semiconductor region of said first conductivity type disposed on said second surface of said semiconductor substrate;

at least one second semiconductor region of a second conductivity type opposite side first conductivity type contacting said first semiconductor region at at least one surface portion thereof and thereby defining at least one PN junction therebetween; and a first electrode contacting said first surface of said semiconductor substrate;

wherein the sum $(S_A + S_C)$ of the total area $S_A$ of the interface between said first and said at least one second semiconductor region defining said at least one PN junction therebetween and the area $S_C$ of the contact surface of said first electrode with said first surface of said semiconductor substrate is less than the difference between the total outer surface area of said second semiconductor region and said substrate and said sum $(S_A + S_C)$ by a prescribed amount.

10. An injection type light emitting diode according to claim 9, wherein said prescribed amount is one-tenth.

11. An injection type light emitting diode according to claim 10, wherein said at least one second semiconductor region comprises a plurality of second semiconductor regions.

12. An injection type light emitting diode according to claim 10, wherein said first semiconductor region has at least one mesa-shaped portion on which said at least one second semiconductor region is disposed.

13. An injection type light emitting diode according to claim 10, further including at least one second electrode disposed in contact with said at least one second semiconductor region.

14. An injection type light emitting diode according to claim 10, wherein said semiconductor substrate is an N-type GaP substrate and each of said first and second semiconductor regions is an N-type semiconductor crystal of a material selected from the group consisting of $GaAs_{1-x}P_x$, $Ga_{1-x}Al_xP$ and $Ga_xIn_xP$, where 0 $x$ 1.

15. An injection type light emitting diode according to claim 14, wherein said material is $GaAs_{1-x}P_x$, wherein 0.4 $x$ 1.

16. An injection type light emitting diode according to claim 15, wherein said at least one second semiconductor region comprises a plurality of second semiconductor regions, each respectively formed on a corresponding plurality of mesa-shaped portions of said first semiconductor region.

* * * * *